(12) United States Patent
Huggett

(10) Patent No.: US 7,236,901 B2
(45) Date of Patent: Jun. 26, 2007

(54) DIGITAL BROADBAND FREQUENCY MEASUREMENT

(75) Inventor: James M. Huggett, Brookline, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 468 days.

(21) Appl. No.: 10/845,941

(22) Filed: May 14, 2004

(65) Prior Publication Data
US 2005/0256657 A1    Nov. 17, 2005

(51) Int. Cl.
G01R 23/00    (2006.01)
H04K 1/02    (2006.01)

(52) U.S. Cl. ........................................ 702/75; 375/297

(58) Field of Classification Search ................ 702/75, 702/57, 66; 324/76.11, 76.12, 76.33; 700/90; 375/349, 350, 297; 455/313, 314, 126; 382/100
See application file for complete search history.

(56) References Cited

U.S. PATENT DOCUMENTS

| | | | | |
|---|---|---|---|---|
| 3,908,114 A * | 9/1975 | White ........................ 708/400 |
| 4,612,545 A | 9/1986 | Asendorf et al. ............. 342/16 |
| 4,633,516 A | 12/1986 | Tsui ........................ 455/226.1 |
| 4,649,536 A | 3/1987 | Krinock ........................ 370/470 |
| 4,888,557 A * | 12/1989 | Puckette et al. ............. 329/341 |
| 5,099,194 A * | 3/1992 | Sanderson et al. ........ 324/76.47 |
| 5,099,243 A * | 3/1992 | Tsui et al. ............... 324/76.47 |
| 5,109,188 A * | 4/1992 | Sanderson et al. ........ 324/76.35 |
| 5,198,748 A | 3/1993 | Tsui et al. ............... 324/76.35 |
| 5,214,708 A | 5/1993 | McEachern ................. 704/266 |
| 5,235,287 A | 8/1993 | Sanderson et al. ........ 324/76.35 |
| 5,291,125 A | 3/1994 | Tsui et al. ............... 324/76.22 |
| 5,321,350 A * | 6/1994 | Haas ........................ 324/76.11 |
| 5,499,391 A | 3/1996 | Tsui ........................ 455/226.2 |
| 5,689,440 A * | 11/1997 | Leitch et al. ............... 370/313 |
| 5,692,020 A * | 11/1997 | Robbins ..................... 375/350 |
| 5,717,715 A * | 2/1998 | Claydon et al. ............ 375/220 |
| 5,999,574 A * | 12/1999 | Sun et al. ................... 375/326 |
| 6,026,129 A * | 2/2000 | Ohta et al. ................. 375/332 |
| 6,411,076 B1 | 6/2002 | Rudish ..................... 324/76.54 |
| 6,678,340 B1 * | 1/2004 | Khlat et al. ................ 375/350 |

(Continued)

OTHER PUBLICATIONS

Johansson et al., Digital Hilbert Transformers Composed of Identical Allpass Subfilters, 1998 IEEE, pp. V-437 to V-440.*

Primary Examiner—John Barlow
Assistant Examiner—Toan M. Le
(74) Attorney, Agent, or Firm—Barry L. Haley

(57) ABSTRACT

The present invention relates to a device and method that digitally replicates the analog processing that is normally associated with an instantaneous frequency measurement device. Specifically, the present relates to a digital frequency measurement device comprising: a filter, where the filter receives an input RF signal and transmits an output signal centered around a desired frequency; a limiting amplifier downstream of the filter, where the amplifier receives and amplifies the output signal; a deserializer downstream of the amplifier that continuously samples the output signal from the limiting amplifier; and a digital frequency measurement processor (DFM), where the DFM receives data at a rate of $\frac{1}{16}$ of the deserializer sample rate. The DFM transforms the data into multiples stages that are combined in order to produce an estimate of the input signal, where the DFM is implemented through a digital processing device.

12 Claims, 1 Drawing Sheet

U.S. PATENT DOCUMENTS 6,798,843 B1 * 9/2004 Wright et al. ................ 375/296
7,027,940 B2 * 4/2006 Iannuzzi ...................... 702/66
7,197,085 B1 * 3/2007 Vella-Coleiro .............. 375/296
2005/0036650 A1 * 2/2005 Bishop et al. .............. 382/100

* cited by examiner

DIGITAL BROADBAND FREQUENCY MEASUREMENT

BACKGROUND OF THE INVENTION

1. Field of the Invention

The present invention relates to a system and method for digital broadband frequency measurement.

2. Description of Related Art

The conventional instantaneous frequency measurement (IFM) receiver is a radio frequency (RF) receiver used primarily in electronic warfare. The IFM measures the frequency of pole signals radiated from a hostile radar and measures the frequencies of incoming RF signals utilizing interferometric techniques by detecting the phase shift magnitudes produced in multiple calibrated delay lines. During normal operation, the received RF signal may be divided and simultaneously introduced into a non-delayed path and a delayed line of known length. The phase differences between the delayed and non-delayed receiver paths are functions of the input signal frequency that include the conversion of the phase different signals and provide signals whose amplitudes are related to the phase delay. The signals typically take the form of sin wt or cos wt where the w is the angular frequency of the L-processed input signal. The sin wt/cos wt signals are delivered to the encoding network which makes the amplitude comparisons of the signals, determines the numeric value of w and generates the digital frequency descriptive word.

The IMF typically splits the input signal into two or more constituent signals by the use of a power divider. One constituent signal is applied to the referenced delay line and the remaining constituent signals are applied to the differential delay lines. Delay lines are applied to the separate channels of a N-channel phase measurement receiver where the difference in delay between the referenced delay line and the differential delay lines causes a frequency dependent phase shift, which is measured by the N-channel phase measurement receiver. The frequency of the input signal is determined from this phase shift by the phase of frequency decoder. The IFM systems existing in the prior art typically use RF components and the delayed lines as described above to accomplish a cascaded set of RF frequency discriminators, which are combined to create a frequency estimate of the largest signal entering the device to an accuracy of about one MGhz. IFM systems typically operate with input bandwidths of several Ghz and an input signal pulses to under 100 nanoseconds.

U.S. Pat. No. 6,411,076 to Rudish (Rudish) relates to an instantaneous frequency measurement receiver that receives a signal from a target and determines the frequency of the signal. The IFM receiver of Rudish uses a method that seeks to minimize the total number of delay lines required to achieve a given accuracy and frequency measurement. The method of Rudish attempts to provide an IFM receiver that minimizes the quantity of delay lines and thus provides a less costly and complex IFM receiver as opposed to the prior art.

U.S. Pat. No. 5,235,287 to Sanderson, et al. (Sanderson) relates to an IFM receiver that attempts to provide a bandwidth improvement through phase shift sampling of real signals. Sanderson discusses a method that allegedly doubles the unambiguous bandwidth of a frequency measurement receiver and measures frequencies over a wide range at a very high sampling frequency. Sanderson, as other IFMs known in the prior art, uses original and delayed signals that are sampled simultaneously. Sanderson discusses the extension of the frequency range by the implementation of an analog to digital converter that receives the output of the IFM.

Although IFM receiver technology is well known and fairly effective, the major disadvantage of the prior art relates to the size, weight and costs associated with the production of the receivers. The IFM receivers used in the prior art usually require analog delay lines that can be up to ten to twenty feet long and therefore increase the size and weight associated with the devices. The size of cable may be limited because it cannot be infinitesimally small since it needs to operate at several GHz frequencies with reasonably small losses. The IFM receivers are typically custom designed and built in small quantities and, therefore, require a significant amount of labor and calibration associated with them.

SUMMARY OF THE INVENTION

The present invention addresses some of the shortcomings of the prior art by providing an improved IFM receiver that replaces analog delay lines with digital delay lines that incorporate a field programmable gate array (FPGA), an application specific integrated circuit (ASIC) or other digital processor. The cost associated with the production of the IFM of the present device is significantly cut because components can be readily purchased without customized modifications. The processing associated with the present invention can be accomplished through the use of a standard FPGA and calibration is eliminated due to the elimination of delay and gain uncertainties associated with the analog delay line.

It is, therefore, an object, of the present invention to provide a digital frequency measurement device comprising: a filter, where the filter receives an input RF signal and transmits an output signal centered around a desired frequency; a limiting amplifier downstream of the filter, where the amplifier receives and amplifies the output signal; a deserializer downstream of the amplifier that continuously samples the output signal from the limiting amplifier; and a digital frequency measurement processor (DFM), where the DFM receives data at a rate of $\frac{1}{16}$ of the deserializer sample rate and transforms the data into multiples stages that are combined in order to produce an estimate of the input signal, where the DFM is implemented through a digital processing device.

It is another object of the present invention to provide a method of digital frequency measurement comprising the steps of: filtering an input RF signal and creating an output signal centered around a desired frequency; transmitting the output signal to a limiting amplifier; amplifying the output signal; transmitting the amplified output signal to a deserializer; continuously sampling the amplified output signal; transmitting, at a rate of $\frac{1}{16}$ sampling rate, the sampled output signal to a digital frequency measurement processor (DFM), where the DFM is a digital processing device; and transforming the sampled data into multiples stages that are combined in order to produce an estimate of the input signal.

In accordance with these and other objects which will become apparent hereinafter, the instant invention will now be described with particular reference to the accompanying drawings.

DETAILED DESCRIPTION

Figure 1:
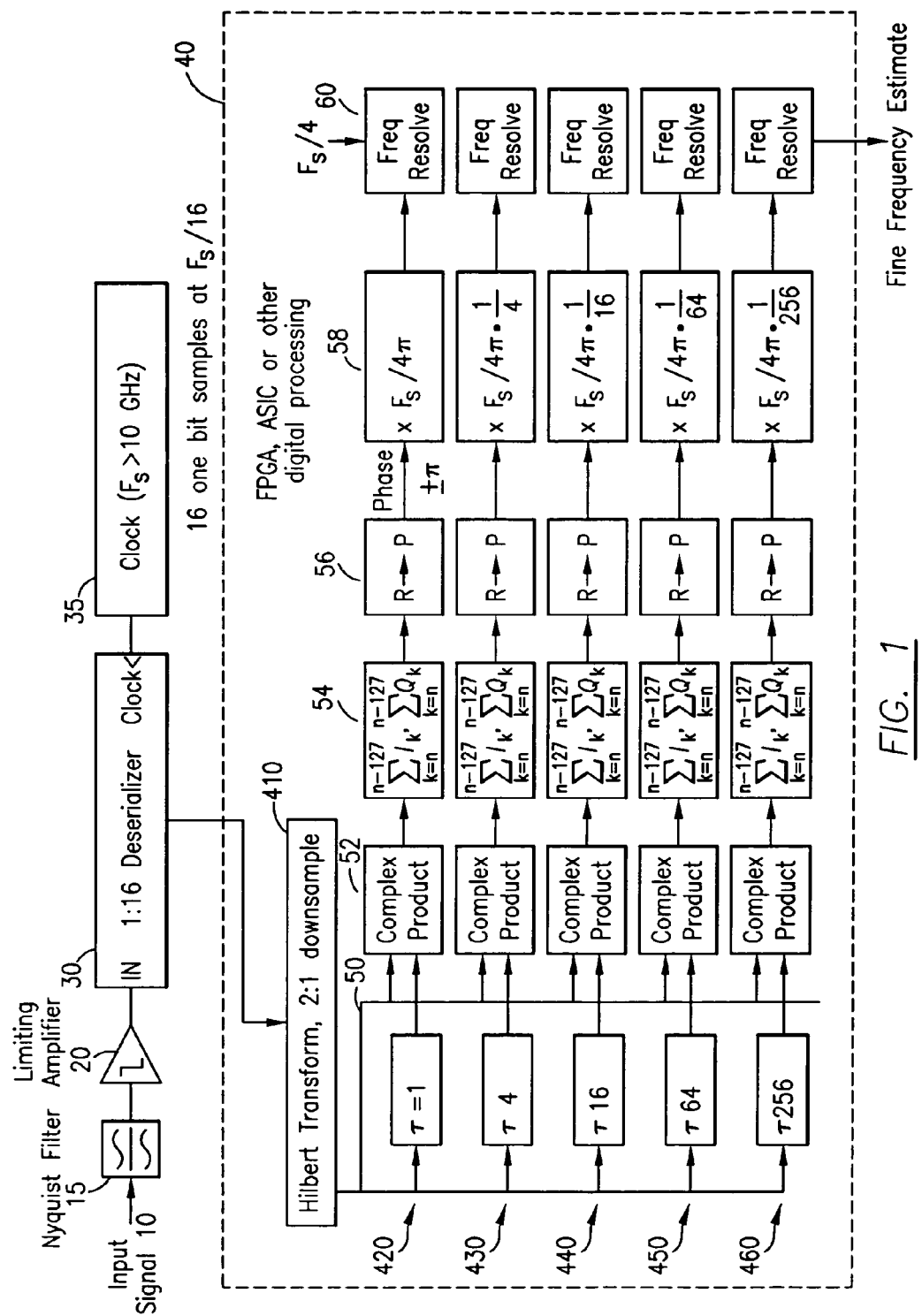
FIG. 1 shows a digital frequency measurement system according to the present invention.

The present invention relates to a device and method that digitally replicates the analog processing that is normally associated with an IFM. Digital components exist today which operate at frequencies from 10 GHz to 40 GHz. The present invention advantageously quantizes a RF signal by using a limiting amplifier and then samples through a high-speed digital circuit a 1 bit data stream that contains all of the information necessary to resolve the frequency of input signals to the same accuracy as an analog IFM. The processing of the one bit data stream may be accomplished by demultiplexing the data into parallel words that may result in a data rate that could be handled by the existing state of the art FPGA or ASIC. The processing algorithm only needs to replicate digitally the analog processing of a traditional FIG. 1 shows the digital frequency measurement system according to the present invention. Filter 15 receives an input signal 10 for frequency band selection. The filter 15 is normally a Nyquist type filter, and therefore selects a frequency band that is generally centered around a $F_s/4$ frequency. The signal then moves downstream to an amplifier 20 that amplifies the signal such that the output will be driven to a positive or negative limited volume even if there is no signal present. The amplifier 20 provides an amplified signal with nearly constant amplitude and as such provides a signal that does not contain any major amplitude variations in order to ensure the proper operation of the present invention.

A deserializer 30 receives the amplified signal from amplifier 20. The deserializer 30 samples the signal at a clock rate 10 GHz, clock 35, as noted in FIG. 1. As shown in FIG. 1, amplifier 20 is essentially a quantizer and the deserializer 30 acts as a sampler, and therefore performs the analog to digital conversion. The positioning of the amplifier 20 and deserializer 30 is reversed as opposed to the traditional A/D architecture that samples the signal initially and then quantizes as the sampling takes place. The deserializer 30 outputs the data into a digital frequency measurement device (DFM) 40 16 bits at a time at a rate of $\frac{1}{16}$ of a sample rate. As shown in FIG. 1, deserializer 30 has a sample rate of 10 GHz therefore the resulting data input into the DFM 40 is at 625 MGHz. The transmission of data at 625 MGHz ensures a FPGA or ASIC, as commonly known in the art, may readily process the data. The DFM 40 receives the data from deserializer 30 and then converts the data from real to complex and down converts to a 0 hz base band. The processing within the DFM 40 includes correlators 420, 430, 440 450 and 460 that yield a good faith estimate that is unbiased by signal to noise ratio (SNR) or signal amplitude. Upon receipt of data from deserializer 30, DFM 40 transforms the data into five versions of itself where each version is a delayed replication of the original version. FIG. 1 shows the integration of 128 samples as an exemplary operation of the DFM 40 that allows operation to less than 0 dB of SNR. Each correlation 420, 430, 440 450 and 460 produces a complex product 52 which is a result of the data signal multiplied by a complex conjugate of its delayed version as created through the Hilbert transform 410. The correlation of the data creates correlations with very short delays and opposing correlations with longer delays, where very short delays will be unambiguous over the desired frequency range but not very precise; as opposed to long delays which will be ambiguous over a set of possible solutions, but will have finer frequency resolution and accuracy as a function of the amount of the delay. The complex products 52 each yield a vector that equals the result of the data signal multiplied by the complex conjugate, which may include a significant amount of noise due to SNR and quantization effects.

The complex products 52 for each respective correlation produce a calculation for in phase data and quadrature data by using formula 54. The in-phase data is derived by taking every even sample while the quadrature data is derived from real data by a logical function that looks at the odd data around the desired sample. The formula for calculating the quadrature data is, $Q(n)=\sum_{k=0}^{\infty} 1/k(x(n+2k+1)-x(n-2k-1))$. The maximum value of k depends on the actual accuracy and resolution required. A max value of k=4 may be adequate for most implementations. When the equation is evaluated with input values of a single bit and output values also rounded to a single bit, then the equation can be implemented as a nested sequence of if/then statements. The output is the sign of $x(n+2k)-x(n-2k)$ for the smallest value of k for which the value is non-zero. In those situations where the result over the maximum value of k evaluated is still zero, a random value can be used in order to minimize bias errors. Conversion to a base band is accomplished by inverting every other output sample. The complex output of each respective correlator includes a phase along with a frequency.

A resultant phase 56 is labeled as R→P, rectangular to polar coordinate conversion. In this exemplary embodiment, only the phase portion of the phase/magnitude polar representation is shown. The resultant phase 56 is subjected to the frequency calculation 58 where frequency resolution is based upon the resultant phase 56. The resultant phase 56 is the result of resultant vector produced due to the complex product 52, where the resultant phase is a fully resolved arctangent function. The correlation stage 420, where the delay is just one complex sample, shows a ±Π in-phase that equates to a ±$F_s/4$. The frequency resolution for the subsequent stages, 430 through 460, is reduced by the amount of delay in each stage, i.e., ¼, ¹⁄₁₆, ¹⁄₆₄, ¹⁄₂₅₆. The frequency resolver 60 takes estimates from previous stages and combines it with an estimate from the current stages to create a composite output. As can be seen in FIG. 1, the estimate for the correlator 420 is $F_s/4\Pi$, where the frequency resolver works by recognizing the actual frequency out of a stage will be some multiple of the ambiguity spacing for that stage plus the measured value for that stage. The preferred embodiment includes the multiple that yields the smallest change in frequency estimate from one stage to the next. The preferred embodiment is accomplished by a deterministic fashion by rounding the difference between the previous estimate and the current estimate divided by the ambiguity interval for the current estimate. The output of the DFM 40 is, therefore, realized by combining in any number of stages, thus providing an arbitrarily fine frequency resolution and accuracy. The amplifier 20 along with the deserializer 30 ensures that the input signal remains stationary over the sampling time interval in order to collect all of the delayed data, where arbitrarily low SNRs may be handled by increasing the correlation length, thus providing appropriate results from the DFM 40.

The instant invention has been shown and described herein in what is considered to be the most practical and preferred embodiment. It is recognized, however, that departures may be made therefrom within the scope of the invention and that obvious modifications will occur to a person skilled in the art.

What is claimed is:

1. A digital frequency measurement device comprising:
   a filter, where the filter receives an input RF signal and transmits an output signal centered around a desired frequency;
   a limiting amplifier downstream of the filter, where the amplifier receives and amplifies the output signal;
   a deserializer downstream of the amplifier that continuously samples the output signal from the limiting amplifier; and
   a digital frequency measurement processor (DFM), where the DFM receives data at a rate of 1/16 of the deserializer sample rate and transforms the data into multiples stages that are combined in order to produce an estimate of the input signal, where the DFM is implemented through a digital processing device, where the DFM comprises a Hilbert transform, a plurality of correlations, a means for creating a plurality of complex products for each correlation, a means to calculate in-phase data and quadrature data, a means to determine phase and frequency for each correlation and a means to resolve and combine the correlations to produce the estimate of the input signal and wherein said means to calculate in-phase data and quadrature data, includes deriving the in-phase data by taking every even sample and deriving the quadrature data from real data by a logical function that looks at the odd data around the desired sample.

2. The digital frequency measurement device according to claim 1, wherein the plurality of correlations includes data with short delays and opposing long delays, where the data with short delays is unambiguous over a given frequency and data with long delays is ambiguous over the given frequency.

3. The digital frequency measurement device according to claim 1, where the quadrature data is calculated by using, $Q(n)=\sum_{k=0}^{\infty} 1/k(x(n+2\ k+1)-x(n-2\ k-1))$.

4. The digital frequency measurement device according to claim 1, where the filter is a Nyquist filter and selects a frequency band that is centered around a $F_s/4$ frequency.

5. The digital frequency measurement device according to claim 1, where the deserializer has a sample rate of 10 GHz and the data input into the DEM is at a rate of 625 MGHz.

6. The digital frequency measurement device according to claim 5, where the digital processing device includes at least one of a FPGA and ASIC.

7. A method of digital frequency measurement comprising the steps of:
   filtering an input RF signal and creating an output signal centered around a desired frequency;
   transmitting the output signal to a limiting amplifier;
   amplifying the output signal;
   transmitting the amplified output signal to a deserializer;
   continuously sampling the amplified output signal;
   transmitting, at a rate of 1/16 sampling rate, the sampled output signal to a digital frequency measurement processor (DEM), where the DFM is a digital processing device; and
   transforming the sampled data into multiple stages;
   creating a plurality of correlations;
   creating a plurality of complex products for each correlation;
   calculating in-phase data and quadrature data, wherein step of calculating includes deriving the in-phase data by taking every even sample and deriving the quadrature data from real data by a logical function that looks at the odd data around the desired sample;
   determining phase and frequency for each correlation;
   resolving each correlation;
   combining the correlations;
   producing an estimate of the input signal; and
   displaying the estimate of the input signal.

8. The method according to claim 7, wherein the plurality of correlations includes data with short delays and opposing long delays, where the data with short delays is unambiguous over a given frequency and data with long delays is ambiguous over the given frequency.

9. The method according to claim 7, further comprising the steps of:
   calculating the quadrature data by using, $Q(n)=\sum_{k=0}^{\infty} 1/k(x(n+2\ k+1)-x(n-2\ k-1))$.

10. The method according to claim 7, further comprising the steps of:
    selecting a frequency band that is centered around a $F_s/4$ frequency, where the filter is a Nyquist filter.

11. The method according to claim 7, further comprising the steps of:
    sampling the amplified output signal at a rate of 10 GHz; and
    transmitting to the DFM is at a rate of 625 MGHz.

12. The method according to claim 7, where the digital processing device includes at least one of a FPGA and ASIC.

* * * * *